United States Patent
Chen et al.

(10) Patent No.: US 9,190,345 B1
(45) Date of Patent: Nov. 17, 2015

(54) SEMICONDUCTOR DEVICES AND METHODS OF MANUFACTURE THEREOF

(71) Applicant: Taiwan Semiconductor Manufacturing Company, Ltd., Hsin-Chu (TW)

(72) Inventors: Szu-Ying Chen, Toufen Township (TW); Tzu-Hsuan Hsu, Kaohsiung (TW); Chao-Yang Yeh, Luzhou (TW); Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/517,648

(22) Filed: Oct. 17, 2014

Related U.S. Application Data

(60) Provisional application No. 62/005,784, filed on May 30, 2014.

(51) Int. Cl.
  *H01L 23/495* (2006.01)
  *H01L 23/48* (2006.01)
  *H01L 21/66* (2006.01)

(52) U.S. Cl.
  CPC ................ *H01L 23/48* (2013.01); *H01L 22/32* (2013.01)

(58) Field of Classification Search
  CPC ........................................ H01L 2/538
  USPC .................................. 257/E21.499; 228/101
  See application file for complete search history.

(56) References Cited

U.S. PATENT DOCUMENTS

| | | | |
|---|---|---|---|
| 2007/0194427 A1* | 8/2007 | Choi et al. | 257/686 |
| 2012/0061854 A1* | 3/2012 | Chow et al. | 257/778 |

* cited by examiner

*Primary Examiner* — Tuan Nguyen
(74) *Attorney, Agent, or Firm* — Slater & Matsil, L.L.P.

(57) ABSTRACT

Semiconductor devices and methods of manufacture thereof are disclosed. In some embodiments, a semiconductor device includes a first hybrid bonded device including a first device and a second device hybrid bonded face-to-face to the first device. The first device includes a first substrate having first bonding connectors and a first bonding layer disposed on a surface thereof. A second hybrid bonded device is bonded back-to-back to the first hybrid bonded device. The second hybrid bonded device includes a third device and a fourth device hybrid bonded face-to-face to the third device. The third device includes a second substrate having second bonding connectors and a second bonding layer disposed on a surface. The second bonding connectors of the third device are coupled to the first bonding connectors of the first device, and the second bonding layer of the third device is coupled to the first bonding layer of the first device.

20 Claims, 6 Drawing Sheets

SEMICONDUCTOR DEVICES AND METHODS OF MANUFACTURE THEREOF

PRIORITY CLAIM AND CROSS-REFERENCE

This application claims priority to U.S. Provisional Application Ser. No. 62/005,784, filed on May 30, 2014 and entitled "Multi-Wafer Stacked Devices and Methods of Forming Same," which application is hereby incorporated herein by reference. This application is also related to U.S. patent application Ser. No. 14/229,114, filed on Mar. 28, 2014 and entitled "Bonding Structure for Stacked Semiconductor Devices," which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques for semiconductor dies.

As semiconductor technologies further advance, stacked semiconductor devices, e.g., 3D integrated circuits (3DICs), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed or stacked on top of one another to further reduce the form factor of the semiconductor device.

Two semiconductor wafers may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
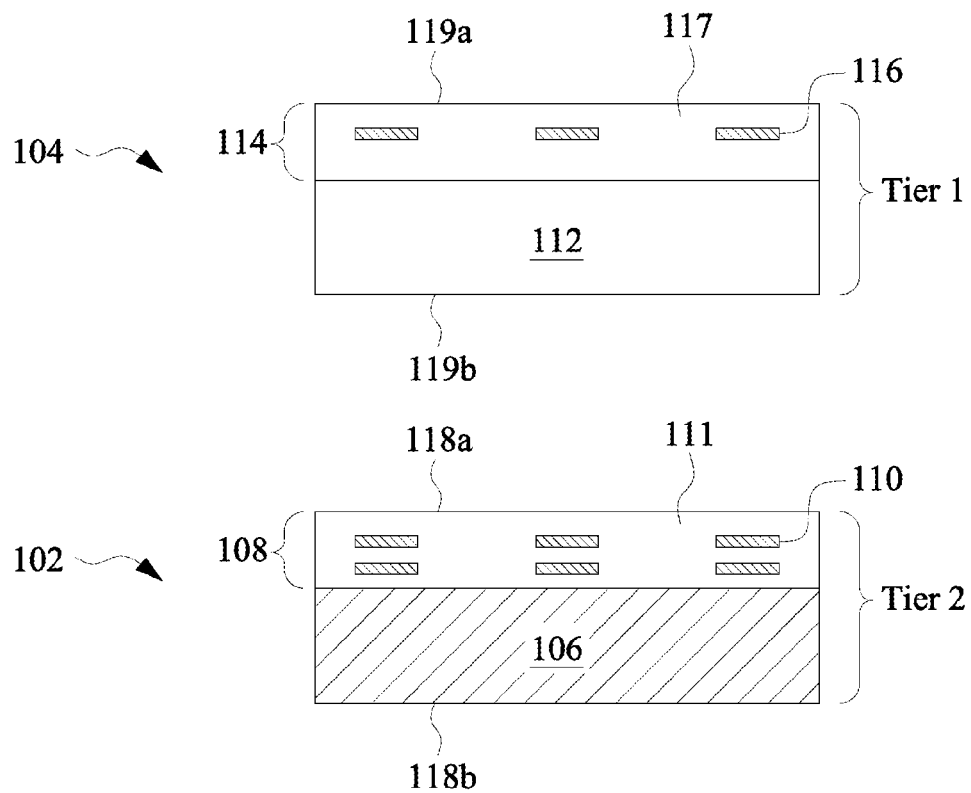
FIGS. 1 through 8 are cross-sectional views that illustrate a method of manufacturing a semiconductor device at various stages in accordance with some embodiments of the present disclosure, wherein two wafers, dies, and/or chips are bonded together vertically.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure disclosed herein comprise novel semiconductor devices and methods of manufacture thereof. Structures and methods for face-to-face and back-to-back hybrid bonding technology to achieve multi-wafer stacking are disclosed. Advantages of some embodiments include improved process-time effectiveness and improved performance of inter-wafer (or inter-die or inter-chip) electrical joints, as examples.

FIGS. 1 through 8 are cross-sectional views that illustrate a method of manufacturing a semiconductor device at various stages in accordance with some embodiments of the present disclosure, wherein two wafers, dies, and/or chips are bonded together vertically. It should be noted that the bonding may be at wafer level, wherein a first wafer and a second wafer are bonded together, and are then singulated into separated dies or packages. Alternatively, the bonding may be performed at a die-to-die level or a die-to-wafer level.

Referring first to FIG. 1, a first device 102 and a second device 104 are shown prior to a bonding process in accordance with various embodiments. The first device 102 comprises a wafer, a die, a chip, or the like, which comprises a Tier 2 device in some embodiments. The second device 104 comprises a Tier 1 device in some embodiments. The second device 104 also comprises a wafer, a die, a chip, or the like. The first device 102 and the second device 104 will be hybrid bonded together in accordance with some embodiments to form a first hybrid bonded device 130 (see FIG. 3). The first hybrid bonded device 130 will then be bonded to a second hybrid bonded device 130' in accordance with some embodiments (see FIG. 9 or 10), to be described further herein.

Referring again to FIG. 1, the first device 102 includes a substrate 106, which may comprise a silicon wafer, a silicon-on-wafer (SOI) substrate, another type of semiconductor substrate, or other supporting substrate (i.e., quartz, glass, etc., as are known in the art), or combinations thereof. An interconnect structure 108 is formed atop or over the substrate 106. The interconnect structure 108 is formed in a back-end-ofline (BEOL), and the substrate 106 comprises circuitry formed in a front-end-of-line (FEOL) in some embodiments, for example. The interconnect structure 108 comprises a plurality of conductive features disposed within a plurality of insulating materials. The interconnect structure 108 may comprise inter-layer dielectrics (ILD) and inter-metallization dielectric (IMD) layers. For example, the insulating materials may be formed of a low-K dielectric material, such as phosphosilicate glass (PSG), borophosphosilicate glass (BPSG), FSG, SiOxCy, spin-on-glass, spin-on-polymers, silicon carbon material, compounds thereof, composites thereof, combinations thereof, or the like, formed using any suitable methods known in the art, such as spinning, chemical vapor deposition (CVD), and plasma-enhanced CVD (PECVD).

The conductive features of the interconnect structure 108 interconnect various passive and active components formed in and on the substrate 106 (not shown) to one another and to external components. The interconnect structure 108 may include, for instance, two or more layers of conductive traces vertically interconnected by vias (not shown) embedded within dielectric layers that are formed using damascene processes or subtractive etch techniques. Two conductive material layers are shown in the interconnect structure 108 in FIG. 1; however, one, two, three, or more layers can be included in the interconnect structure 108 of the first device 102. Regardless of the number of layers of the interconnect structure 108, the first device 102 includes a top interconnect layer 110. The interconnect layers 110 comprise conductive features such as conductive lines or plugs that comprise a conductive material such as copper, a copper alloy, or other metals.

The term "top" is used throughout this description to refer to a layer or other structure that is most distal the substrate, relative to other layers or structure, notwithstanding the fact that the device might at some point be flipped, wherein the most distal layer or structure becomes located at the bottom of the structure. The interconnect structure 108 may also include a top passivation layer or top dielectric layer 111 in which the top interconnect layer 110 is embedded. In some embodiments, a portion of the top passivation layer or top dielectric layer 111 is formed on top of the top interconnect layer 110, as shown in FIG. 1. The top interconnect layer 110 comprises an uppermost interconnect layer of the interconnect structure 108, for example.

The second device 104 likewise has a substrate 112 upon which is formed an interconnect structure 114. The interconnect structure 114 includes a top or uppermost interconnect layer 116 and a top passivation or top dielectric layer 117. The second device 104 may be, but need not necessarily be, the same type of device as the first device 102, and may be manufactured using similar processes and may include similar structures and materials as the first device 102. Alternatively, the second device 104 may comprise a different type of device than the first device 102, and the second device 104 may be manufactured using different processes, structures and materials. In the illustrated embodiments, the second device 104 has only one interconnect layer disposed within the interconnect structure 114. Thus, the top interconnect layer 116 is the only illustrated layer of the interconnect structure 114. However, the interconnect structure 114 may alternatively comprise two, three, or more layers of conductive features, and the top interconnect layer 116 may comprise the topmost of the conductive material layers of the interconnect structure 114, in some embodiments.

The first device 102 has a first side 118a and a second side 118b that is opposite the first side 118a. The first side 118a comprises a front side or a face side of the first device 102, and the second side 118b comprises a back side of the first device 102, for example. Likewise, the second device 104 has a first side 119a and a second side 119b that is opposite the first side 119a. The first side 119a comprises a front side or a face side of the second device 104, and the second side 119b comprises a back side of the second device 104, for example.

Figure 2:
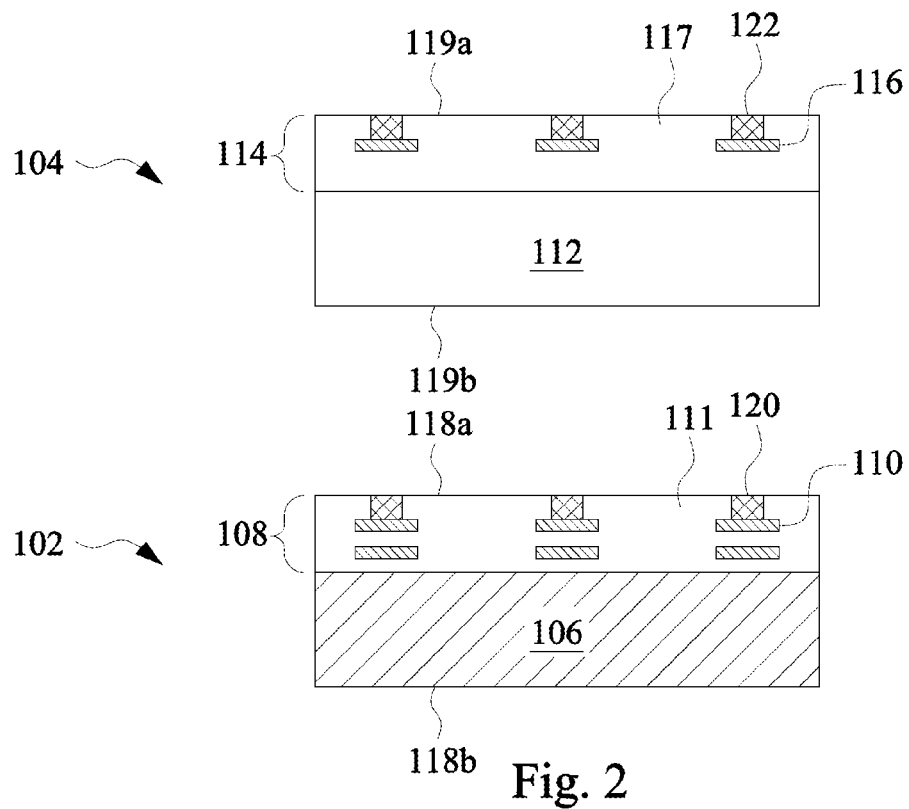

In FIG. 2, a plurality of bonding connectors 120 and 122 are formed on the first device 102 and the second device 104, respectively. The bonding connectors 120 and 122 are coupled to portions of the top interconnect layers 110 and 116 of the first device 102 and the second device 104, respectively. The bonding connectors 120 and 122 are coupled to conductive features of the top interconnect layers 110 and 116, respectively. The bonding connectors 120 and 122 may be formed by patterning the upper insulating material layers 111 and 117 of interconnect structures 108 and 114, respectively, and filling the patterns with a conductive material. The patterns in the upper insulating material layer 111 and 117 comprise a first hybrid bond pad pattern in some embodiments, for example.

The bonding connectors 120 and 122 may be formed using a damascene technique, by patterning the upper insulating material layers 111 and 117 of the interconnect structures 108 and 114 using lithography or a direct patterning method, and forming a conductive material such as copper, aluminum, tungsten, other metals, or alloys, combinations, or multiple layers thereof, over the patterned insulating material layers. Excess conductive material is then removed from over the top surface of the insulating material layers 111 and 117 using a chemical mechanical polishing (CMP) process, grinding process, and/or etch process, as examples. The bonding connectors 120 and 122 comprise hybrid bond pad (HBP) connectors in some embodiments, for example, that are used to bond the first device 102 and the second device 104 together in a hybrid bonding process. The remaining portions of the uppermost insulating material layers 111 and 117 also function as bonding layers of the first device 102 and the second device 104 in the hybrid bonding process.

For example, in a damascene method, patterning the top passivation layer or dielectric layers 111 and 117 of the first device 102 and the second device 104 forms openings in the top passivation layer or top dielectric layers 111 and 117 of the first device 102 and the second device 104. Forming the conductive material over the patterned top dielectric layers 111 and 117 fills the openings with the conductive material. After the excess conductive material is removed from over the top surfaces of the top passivation layer or top dielectric layers 111 and 117, the conductor-filled openings form the bonding connectors 120 and 122 that will be aligned and bonded together as described below. The bonding connectors 120 and 122 electrically contact traces in the top interconnect layers 110 and 116 at first ends, and are substantially coplanar with the respective top passivation or top dielectric layers 111 and 117 at second ends. In some embodiments, the bonding connectors 120 and 122 may have a width of about 0.2 µm to about 3 µm and a height of about 0.3 µm to about 0.9 µm, as examples. Alternatively, the bonding connectors 120 and 122 may comprise other dimensions. The actual dimensions depend upon the process technology node employed, the number of bonding connectors required, whether power or a signal is being routed through a particular bonding connector, and other factors that will be apparent to those skilled in the art.

The bonding connectors 120 and 122 may also be formed using a subtractive etch process. Insulating material layers of the interconnect structures 108 and 114 may be substantially coplanar with conductive features in the top interconnect layers 110 and 116, for example. A conductive material may be formed over the interconnect structures 108 and 114, and the conductive material may be patterned using a lithography process to form the bonding connectors 120 and 122. Insulating materials 111 and 117 can then be formed around the patterned conductive material to form a planar bonding surface on the first device 102 and the second device 104 comprised of the top dielectric layers 111 and 117 and the bonding connectors 120 and 122, respectively.

The bonding connectors 120 and 122 of the first device 102 and the second device 104 comprise substantially the same pattern in some embodiments, so that the first device 102 and the second device 104 may be bonded together using the bonding connectors 120 and 122 to form electrical connections between the first device 102 and the second device 104. The patterns for the bonding connectors 120 and 122 are aligned in some embodiments, for example.

Figure 3:
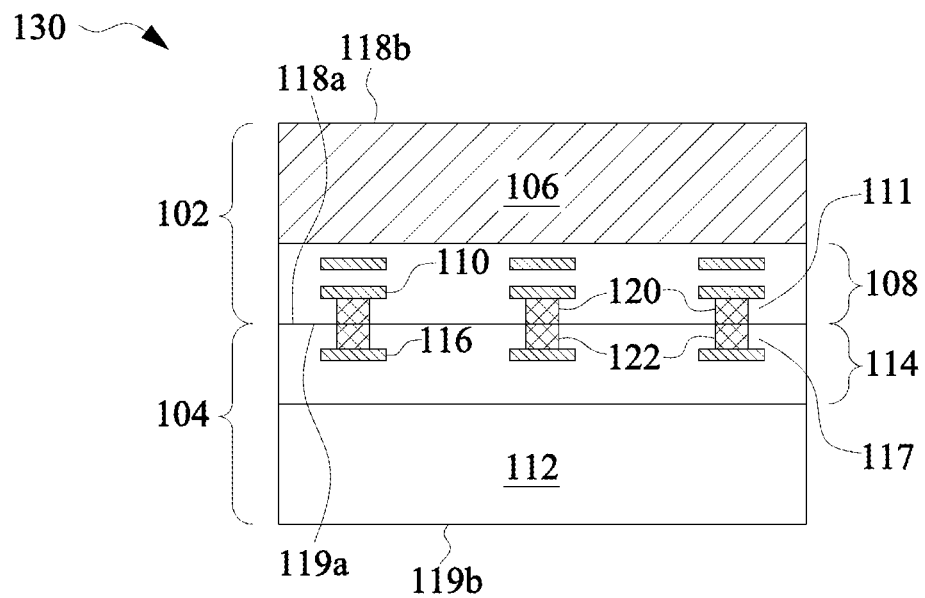

FIG. 3 illustrates the first device 102 and the second device 104 after a hybrid bonding process has been performed in accordance with some embodiments, forming a hybrid bonded device 130. The first device 102, which was shown disposed beneath the second device 104 in FIGS. 1 and 2, is now shown on top of the second device 104, as the first device 102 has been flipped over and bonded face-to-face to the second device 104. FIG. 3 illustrates the first device 102 and the second device 104 bonded together in a face-to-face configuration using hybrid bonding, for example. The first side 118a of the first device 102 is bonded to the first side 119a of the second device 104 in a face-to-face configuration.

Bonding of the first device 102 to the second device 104 is achieved through the joint bonding mechanisms of the respective top passivation layers or top dielectric layers 111 and 117 being bonding together, and also the respective and aligned bonding connectors 120 of the first device 102 and bonding connectors 122 of the second device 104 being aligned and bonded together. For instance, in embodiments wherein the respective top passivation or top dielectric layers 111 and 117 are both oxide materials, an oxide-oxide bond is formed between the top passivation or top dielectric layers 111 and 117. In embodiments wherein the bonding connectors 120 and 122 are both formed of copper, the copper in the bonding connectors 120 and 122 forms a copper-copper bond.

Thus, the first device 102 and the second device 104 are hybrid bonded by a plurality of bonding connectors disposed in an uppermost interconnect layer of the interconnect structure 108 of the first device 102 and the second device 104. The bonding connectors 120 and 122 provide vertical electrical connections between the first device 102 and the second device 104, e.g., between conductive features in the top interconnect layers 110 and 116 of the interconnect structure 108, respectively.

Figure 4:
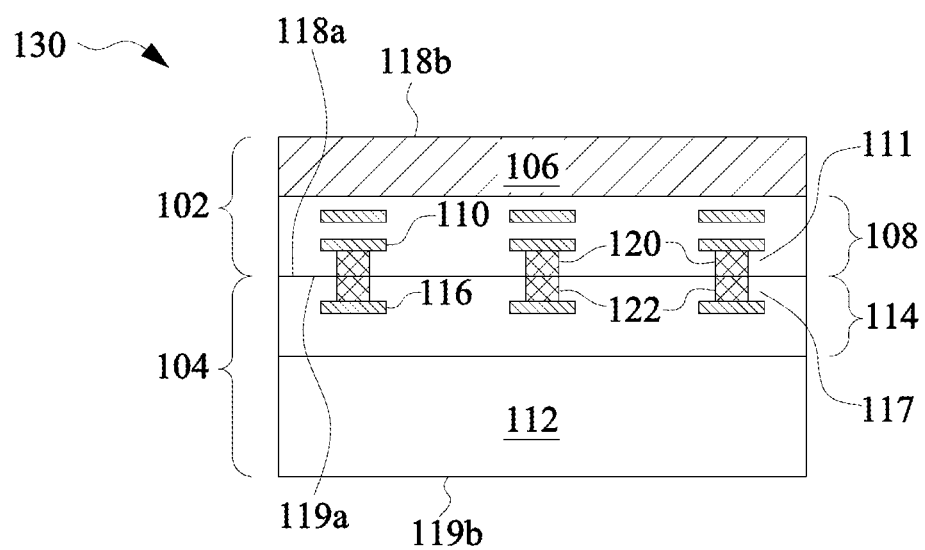

After the hybrid bonding process shown in FIG. 3, a portion of the substrate 106 of the first device 102 is removed, as shown in FIG. 4, which illustrates a step of thinning down the substrate 106 of the first device 102. In some embodiments, substrate 106 may be thinned down to a thickness of about 5 μm to about 50 μm, as an example. In other embodiments, the substrate 106 may be thinned down to other thicknesses.

Figure 5:
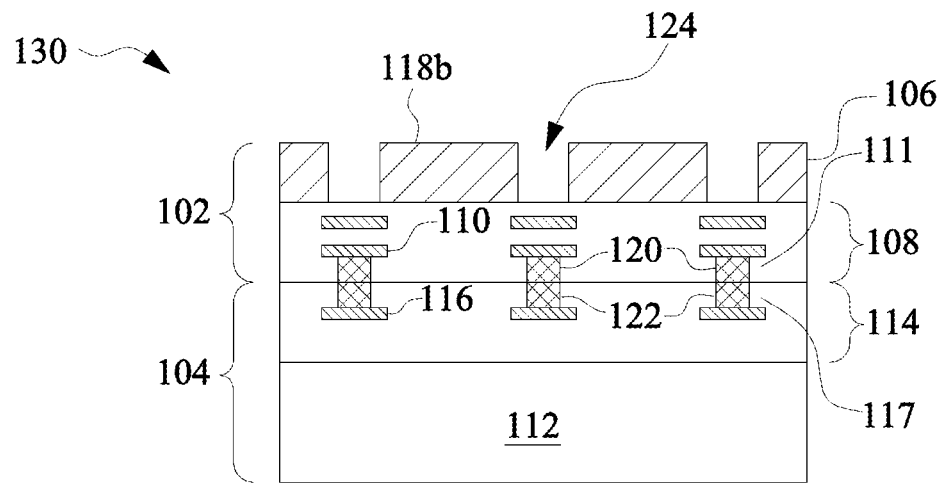

Next, openings 124 are etched through the substrate 106 of the first device 102, as shown in FIG. 5. Three openings 124 are illustrated, but one skilled in the art will recognize that numerous such openings 124 may be formed in the substrate 106 in some applications. The openings 124 are formed in order to form bonding connectors 128 (see FIG. 8) on the second side 118b (which comprises a back side) of the first device 102 so that a second hybrid bonding step can be performed to another device, which will be described further herein. The openings 124 may comprise a circular, oval, square, rectangular, or other shapes in a top view. The openings 124 may comprise similar dimensions as described for the bonding connectors 120 and 122, for example.

The openings 124 may be formed using a lithography process, by forming a layer of photoresist (not shown) over the substrate 106 and patterning the layer of photoresist. The layer of photoresist may be patterned by exposing the layer of photoresist to light or energy reflected from or through a lithography mask having a desired pattern thereon, developing the layer of photoresist, and removing exposed or unexposed portions (depending on whether the photoresist is positive or negative) of the layer of photoresist using an ashing and/or etching process. The patterned layer of photoresist is then used as an etch mask while portions of the substrate 106 are removing using an etch process, forming the openings 124. The layer of photoresist is then removed. Alternatively, the substrate 106 may be patterned using a direct patterning process.

Figure 6:
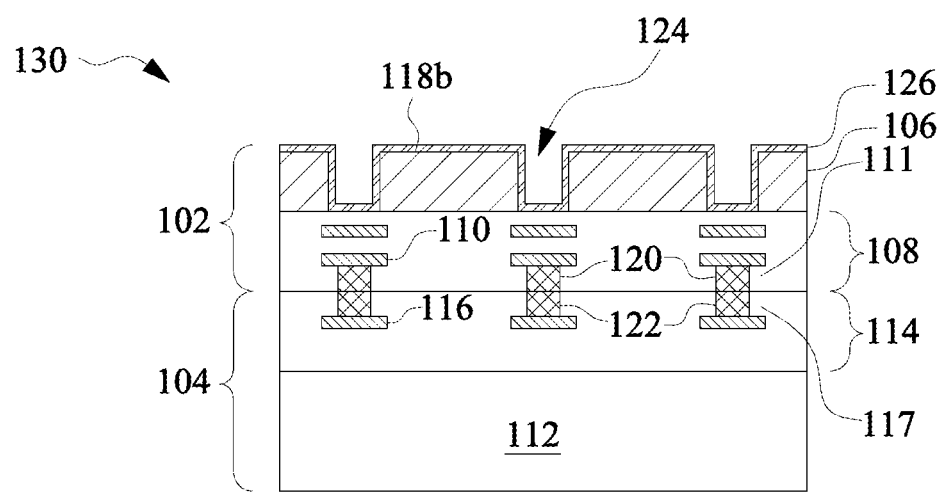

An isolation layer 126 is then formed over the patterned substrate 106 of the first device 102, as shown in FIG. 6. The isolation layer 126, which comprises a dielectric material such silicon oxide, silicon nitride, or the like, is formed or deposited over the back side of substrate 106. The isolation layer 126 extends into and lines the openings 124 in the substrate 106 of the first device 102. The isolation layer 126 electrically isolates conductive material that will be formed in the openings 124 from the surrounding semiconductor material of substrate 106, for example. The isolation layer 126 may be formed using chemical vapor deposition (CVD) or other methods and may comprise a thickness of several μm, for example. Alternatively, the isolation layer 126 may comprise other materials, formation methods, and dimensions. The isolation layer 126 is used as a bonding layer to form an oxide-to-oxide hybrid bond to another hybrid bonded device 130' (see FIGS. 9 and 10) in some embodiments.

Figure 7:
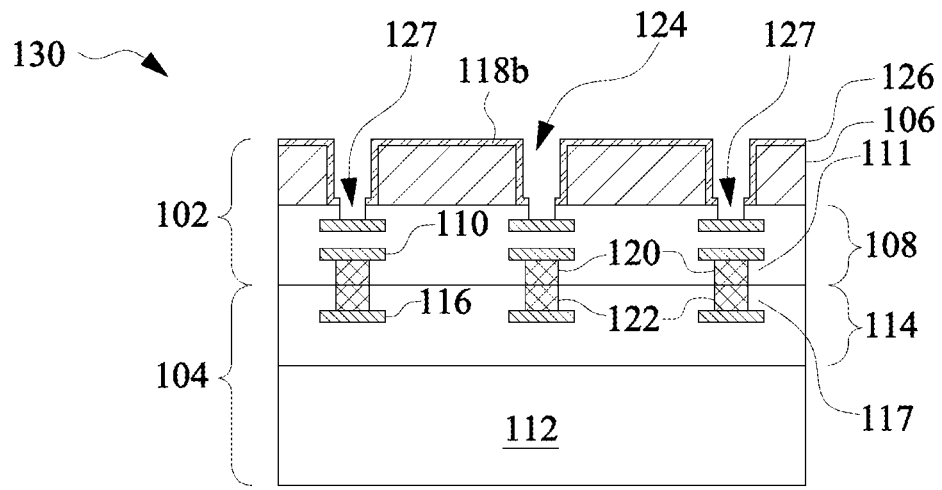

Referring next to FIG. 7, openings 127 are then formed using lithography or a direct patterning method in the isolation layer 126 and an insulating material of the interconnect structure 108 of the first device 102. Portions of conductive features of the interconnect structure 108 are exposed through the openings 127 so that electrical contact can be made to the conductive features. The openings 127 are each disposed below an opening 124 in the substrate 106.

In some embodiments, forming the openings 124 and 127 comprises etching a trench in a back side 118b of the substrate 106 of the first device 102 through to a metal interconnect layer of the interconnect structure 108 of the first device 102. The openings 127 and 124 form a second pattern for hybrid bond pads on the second side 118b of the first device 102.

Figure 8:
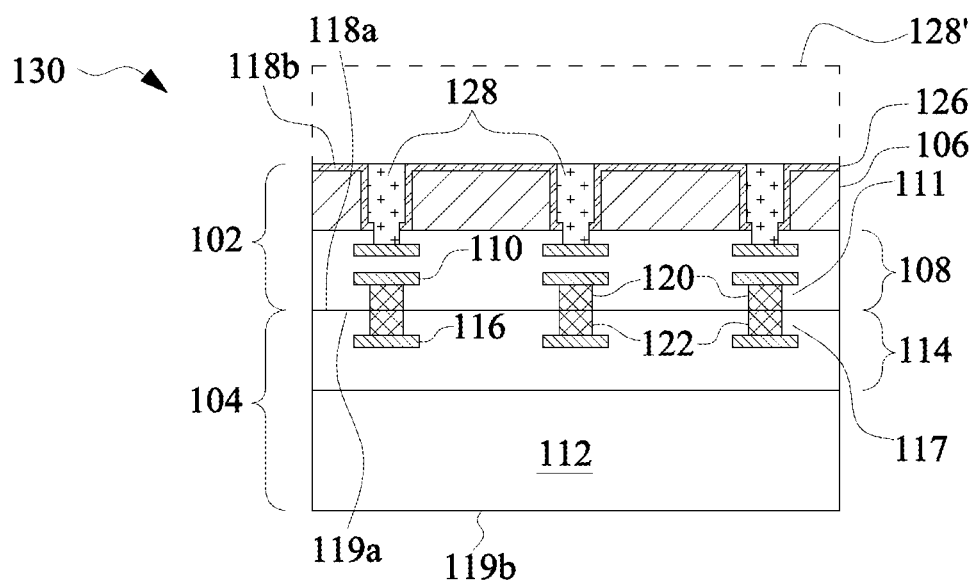

Conductive material is then filled into the openings 124 and 127 over the isolation layer 126 to form bonding connectors 128, as shown in FIG. 8. The conductive material may comprise copper, a copper alloy, other metals, or multiple layers or combinations thereof. In embodiments wherein the openings comprise trenches, the conductive material fills the trenches and forms bonding connectors 128 on the back side of the first device 102. As deposited, the conductive material may reside over the top surface of the isolation layer 126, as shown at 128'. Excess conductive material is removed using a CMP process, an etch process, a grinding process, or combinations thereof, leaving the conductive material in the openings 124 and 127 and forming the bonding connectors 128. The bonding connectors 128 comprise back side bonding connectors 128 of the first device 102.

Unlike the first bonding connectors 120 and 122 that were formed on face surfaces (e.g., the first sides 118a and 119a) of devices 102 and 104, respectively, bonding connectors 128 are formed on a back side of the first device 102 that comprises a Tier 2 device, i.e., on a back side of the substrate 106 of the first device 102. The back side bonding connectors 128 allow for yet further vertical integration by providing the ability to stack additional wafers, dies, or chips atop or over the hybrid bonded device 130 comprising the first device 102 that is a Tier 2 device 102 and the second device 104 that is a Tier 1 device.

Figure 9:
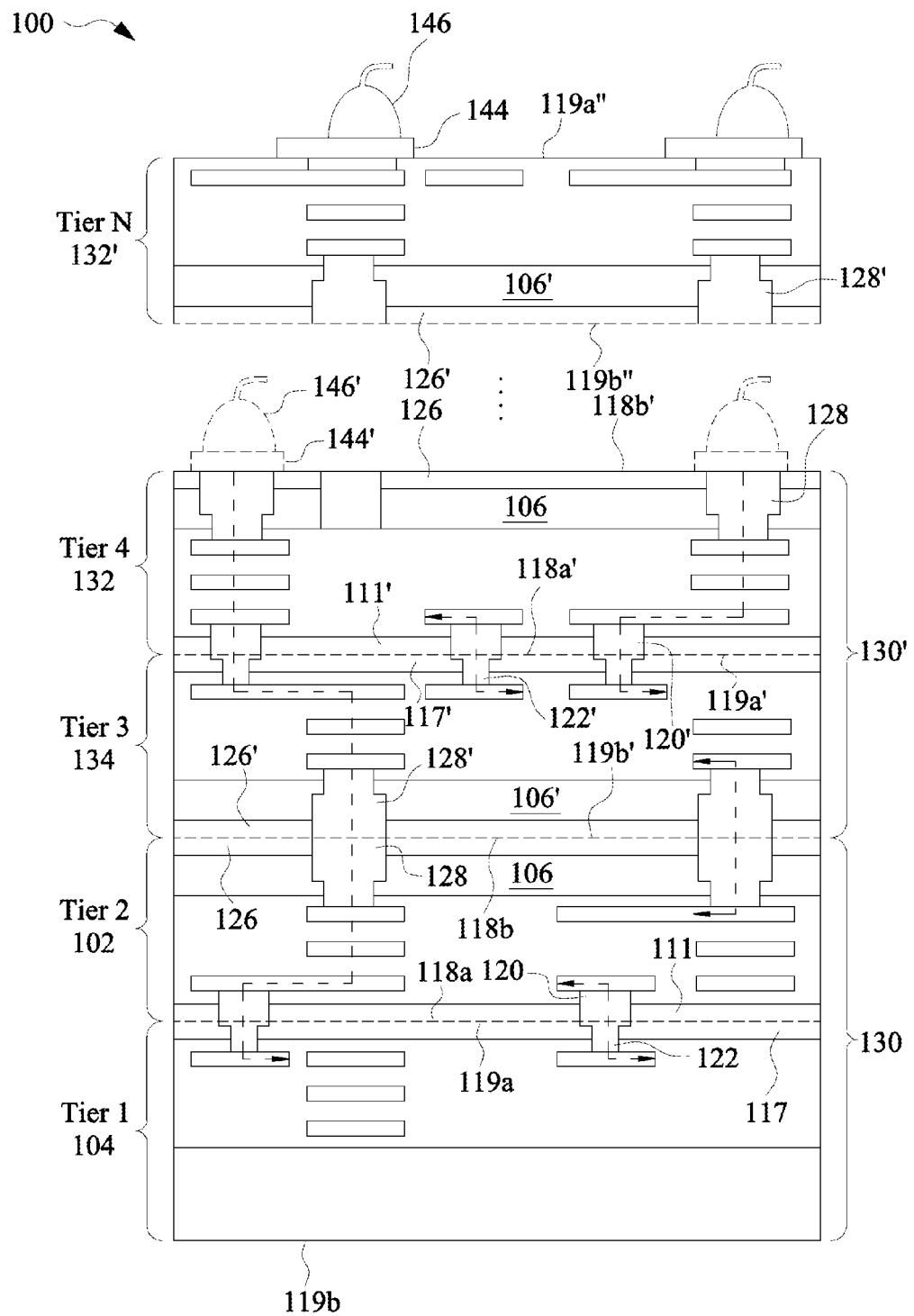
FIGS. 9 and 10 are cross-sectional views that illustrate semiconductor devices in accordance with some embodiments that comprise vertically integrated and stacked devices.
Figure 10:
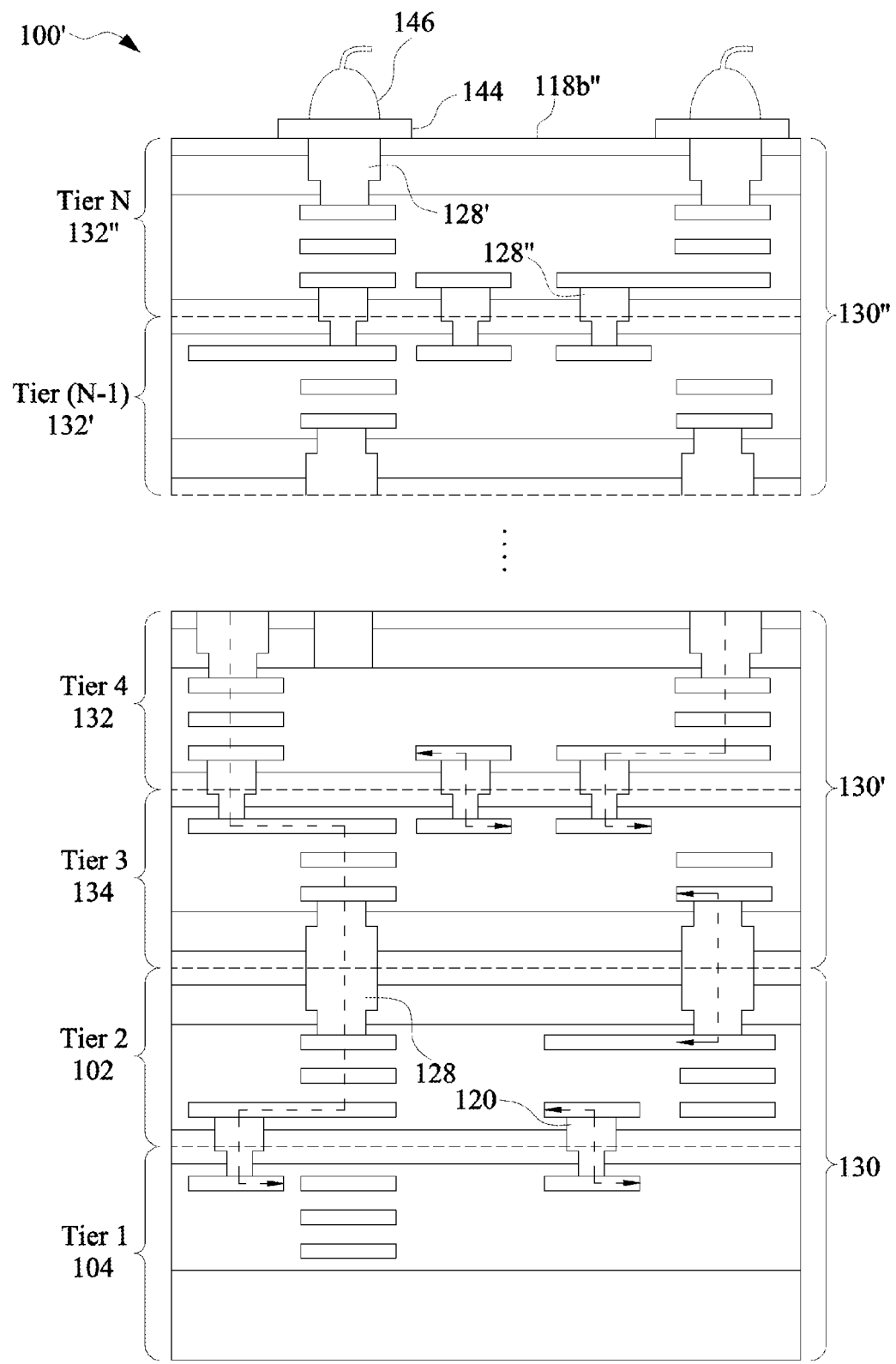

For example, FIGS. 9 and 10 illustrate cross-sectional views of semiconductor devices 100 and 100' that comprise multiple devices 104, 102, 134, 132, and 132' that are vertically stacked together for further vertical integration. In FIG. 9, an embodiment is illustrated wherein two hybrid bonded devices 130 and 130' are vertically stacked and integrated together. The first hybrid bonded device 130 comprises a stacked Tier 1 second device 104 and Tier 2 first device 102, such as shown in FIG. 8, wherein the first device 102 is hybrid bonded to the second device 104 in a face-to-face configuration. The first side 118a of the first device 102 is hybrid bonded to the first side 119a of the second device 104, for example. Bonding connectors 122 and 120 are bonded together, and insulating material layers 111 and 117 are bonded together, using hybrid bonds.

The second stacked device 130' comprises a Tier 3 third device 134 and a Tier 4 fourth device 132, with the Tier 3 third device 134 and the Tier 4 fourth device 132 being stacked and vertically integrated in a similar manner as illustrated and described for devices 102 and 104 in FIGS. 1 through 8 in a face-to-face configuration. The first side 119a' of the third device 134 is hybrid bonded to the first side 118a' of the fourth device 132. Bonding connectors 120' and 122' are bonded together, and insulating material layers 111' and 117' are bonded together using hybrid bonds.

The hybrid bonded devices 130 and 130' comprise stacked devices that are hybrid bonded together in a back-to-back configuration, also shown in FIG. 9. The second side 119b' of the third device 134 is hybrid bonded to the second side 118b of the first device 102. Bonding connectors 128 and 128' of the first device 102 and the third device 134, respectively, are bonded together, and an insulating material layer 126 and 126' disposed over the substrates 106 and 106', respectively, of the first device 102 and the third device 134 are bonded together using hybrid bonds.

A contact pad 144' comprising aluminum or other materials may be coupled to the hybrid bond pads or bonding connectors 128 disposed proximate a surface of the substrate 106 of the top fourth device 132 in some embodiments, as shown in phantom (e.g., in dashed lines) in FIG. 9. A connector 146' may be coupled to each of the contact pads 144', also shown in phantom. The connector 146' comprises an external connector such as a solder ball, solder bump, conductive pillar, or other materials. The connector 146' may comprise a eutectic material that is adapted to re-flow when heated to a predetermined temperature in some embodiments. The connector 146' may be used to couple the semiconductor device 100 to another object, such as a printed circuit board (PCB) or other end applications.

In some embodiments, four devices 104, 102, 134, and 132 are bonded together using alternating face-to-face hybrid bonds and back-to-back hybrid bonds. In other embodiments, greater than four devices 104, 102, 134, 132, and 132' are bonded together. For example, in FIG. 9, a fifth device 132' comprising a Tier N device is illustrated that can be bonded to the fourth device 132 using a back-to-back hybrid bond. Bonding connectors 128 and 128' of the fourth device 132 and the fifth device 132' are bonded together, and the insulating materials 126 and 126' disposed over the substrates 106 and 106', respectively, are bonded together using hybrid bonds. The insulating materials 126 and 126' comprise bonding layers for the hybrid bonding process, for example.

Again, note that the first hybrid bonded device 130 is hybrid bonded to the second hybrid bonded device 130' in a back-to-back configuration, meaning that the back side 118b of device 102 of the first hybrid bonded device 130 is bonded to the back side 119b' of device 134 of the second hybrid bonded device 130'. This back-to-back bonding is a hybrid bond wherein the insulating material 126 disposed on the substrate 106 on the back side 118b of device 102 is bonded (e.g., oxide-oxide bonded) to the insulating material 126' disposed on the substrate 106' on the back side 119b' of device 134, and back side bonding connectors 128 on the back side 118b of device 102 are likewise bonded (e.g., copper-copper bonded) to back side bonding connectors 128' on the back side 119b' of device 134. Hence, the completed stacked semiconductor device 100 includes a first stacked device 130 having two devices 102 and 104 that are hybrid bonded in a face-to-face configuration, and a second stacked device 130' having two devices 132 and 134 that are hybrid bonded in a face-to-face configuration, wherein the two stacked devices 130 and 130' are hybrid bonded in a back-to-back configuration.

Each of the devices 104, 102, 134, 132, and 132' is alternatingly hybrid bonded face-to-face, back-to-back, face-to-face, back-to-back, etc. This pattern could be included to have one set of devices 130 and 130', two sets of devices 130 and 130', or more. The number of devices 104, 102, 134, 132, and 132' that can be vertically stacked is a matter of design choice, for example.

In some embodiments, after the first through fourth devices 104, 102, 134, and 132 are hybrid bonded together, a plurality of additional stacked devices such as the fifth device 132' can be formed or provided. A method of forming the semiconductor device 100 then comprises sequentially hybrid bonding each of the plurality of additional stacked devices 132' to a top device of the semiconductor device 100, wherein a first one of the plurality of additional stacked devices 132' is hybrid bonded to the fourth device 132, for example.

Two or more devices 104, 102, 134, 132, and 132' can be hybrid bonded together, and then hybrid bonded to one or more devices. Alternatively, the devices 104, 102, 134, 132, and 132' can be sequentially hybrid bonded to a top device one at a time.

The devices 104, 102, 134, 132, and 132' in the stack are hybrid bonded using both oxide-oxide bonds and copper-copper bonds. For example, for the semiconductor device 100 shown in FIG. 9, a hybrid bonding method in some embodiments comprises oxide-oxide bonding face side passivation layers 111 and 117 of the first device 102 and the second device 104, oxide-oxide bonding face side passivation layers 111' and 117' of the third device 134 and the fourth device 132, and oxide-oxide bonding the back side passivation layers 126 and 126' of the first device 102 and the third device 134. The hybrid bonding method further comprises copper-copper bonding the face side bonding connectors 120 and 122 of the first device 102 and the second device 104, copper-copper bonding the face side bonding connectors 120' and 122' of the third device 134 and the fourth device 132, and copper-copper bonding the back side bonding connectors 128 and 128' of the first device 102 and the third device 134, in some embodiments.

FIG. 9 illustrates a configuration with an odd number of stacked devices 104, 102, 134, 132, and 132'. The top device 132' is equivalent to a Tier 1 first device 104 in terms of the bonding pattern of the bonding connectors 128'. The top or fifth device 132' is back side to back side (back-to-back) bonded to underlying fourth device 132 and has its face side 119a" exposed. External electrical connections, such as contact pads 144 and external connectors 146, can be included and employed to electrically connect to the top device 132', and hence, to the remainder of the stacked devices 132, 134, 102, and 104. In embodiments wherein an odd number of stacked devices 104, 102, 134, 132, and 132' is included in the semiconductor device 100, the contact pads 144 are coupled to conductive features in an uppermost interconnect layer of the interconnect structure of the top device 132'.

FIG. 10 illustrates a configuration with an even number of stacked devices 104, 102, 134, 132, 132' and 132". All of the elements are not labelled again in FIG. 10; see FIG. 9. The top device 132" comprises a Tier N device and is equivalent to a Tier 2 first device 102 in terms of the bonding pattern of the bonding connectors 128' and 128" (e.g., similar to bonding connectors 120 and 128 of the first device 102). The top device 132" is face-to-face bonded to an underlying device 132' which comprises a Tier (N−1) device. The back side bonding connectors 128' located on the back side 118b" of the top Tier N device 132" are exposed. Rather than being used for hybrid bonding to an adjacent device in a vertical stack, the back side bonding connectors 128' of top device 132" can be used for external electrical connection, such as through use of contact pads 144 coupled to bonding connectors 128' on the back side 118b" of the top device 132", and external connectors 146 coupled to the contact pads. Thus, in embodiments wherein the semiconductor device 100' comprises an even number of stacked devices 104, 102, 134, 132, 132' and 132", the contact pads 144 may be coupled to bonding connectors 128' disposed within a substrate of the top fifth device 132", as illustrated in FIG. 10.

In some embodiments, the top-most device 132, 132', or 132" comprises a backside illumination sensor (BIS) device and at least one of the other devices 104, 102, 132, or 134 comprises a logic circuit, such as an application specific integrated circuit (ASIC) device. The BIS device may include photo active regions, such as photo-diodes formed by implanting impurity ions into the epitaxial layer. The photo active regions may comprise PN junction photo-diodes, PNP photo-transistors, NPN photo-transistors, or the like. The BIS device may include a sensor that is formed in an epitaxial layer over a silicon substrate. In other embodiments, the devices 104, 102, 132, 134, 132', and 132" may comprise logic circuits, analog-to-digital converters, data processing circuits, memory circuits, bias circuits, reference circuits, and the like.

Note that the various elements such as the devices, bonding connectors, etc., are referred to herein as being "first", "second", "third", etc., in order of introduction, such as in the claims.

Embodiments of the present disclosure include semiconductor devices that include stacks of wafers, dies, or chips that are vertically stacked. Embodiments of the present disclosure also include methods of manufacturing the semiconductor devices.

Advantages of some embodiments of the present disclosure include providing novel methods of stacking semiconductor devices, wherein through-vias are not required in the vertical stacks. Rather, hybrid bond pad connectors are formed in a through-via type of fashion in substrates and interconnect structures of the devices and are used for electrically connecting the devices. Thus, methods of stacking multiple devices are achieved at a lower cost, process time savings and effectiveness, and greater through-put. More electrical joints between devices are achievable. Both face-to-face and back-to-back hybrid bonding is used to realize multi-wafer and multi-device stacking. Furthermore, the structures and methods described herein are easily implemented in manufacturing process flows.

In some embodiments, a semiconductor device includes a first hybrid bonded device including a first device and a second device hybrid bonded face-to-face to the first device, the first device including a first substrate having a plurality of first bonding connectors and a first bonding layer disposed on a surface thereof. The semiconductor device also includes a second hybrid bonded device bonded back-to-back to the first hybrid bonded device, the second hybrid bonded device including a third device and a fourth device hybrid bonded face-to-face to the third device. The third device includes a second substrate having a plurality of second bonding connectors and a second bonding layer disposed on a surface thereof. The plurality of second bonding connectors of the third device is coupled to the plurality of first bonding connectors of the first device. The second bonding layer of the third device is coupled to the first bonding layer of the first device.

In other embodiments, a semiconductor device includes a first device including a first face side bonding connector and a first face side bonding layer, and a second device vertically stacked above the first device and hybrid bonded to the first device in a face-to-face configuration. The second device includes a second face side bonding connector bonded to the first face side bonding connector and also includes a second face bonding layer bonded to the first face side bonding layer. The second device further includes a first back side bonding connector formed in a substrate thereof and a first back side bonding layer formed on a back side of the substrate. The semiconductor device includes a third device vertically stacked above the second device and hybrid bonded to the second device in a back-to-back configuration. The third device includes a second back side connector formed in a substrate thereof bonded to the first back side bonding connector and a second back side bonding layer bonded to the first back side bonding layer. The third device further includes a third face side bonding connector and a third face side bonding layer. The semiconductor device also includes a fourth device vertically stacked above the third device and hybrid bonded to the third device in a face-to-face configuration. The fourth device includes a fourth face side bonding connector bonded to the third face side bonding connector, and a fourth face side bonding layer bonded to the third face side bonding layer.

In some embodiments, a method of manufacturing a semiconductor device includes forming a first stacked device and forming a second stacked device. The first stacked device is formed by forming a face side bonding connector and a face side passivation layer on face sides of a first device and a second device, and hybrid bonding the first device and the second device by bonding together the face side passivation layers of the first device and the second device and bonding together the face side bonding connectors of the first device and the second device. A back side bonding connector and a back side passivation layer are formed on a back side of the first device. The second stacked device is formed by forming a face side bonding connector and a face side passivation layer on face sides of a third device and a fourth device, and hybrid bonding the third device and the fourth device by bonding together the face side passivation layers of the third device and the fourth device and bonding together the face side bonding connectors of the third device and the fourth device. A back side bonding connector and a back side passivation layer are formed on a back side of the third device. The method includes hybrid bonding the first stacked device and the second stacked device by bonding together the back side passivation layers of the first device and the third device and bonding together the back side bonding connectors of the first device and the third device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first hybrid bonded device comprising a first device and a second device, the second device hybrid bonded face-to-face to the first device, the first device including a first substrate having a plurality of first bonding connectors and a first bonding layer disposed on a surface thereof; and
    a second hybrid bonded device bonded back-to-back to the first hybrid bonded device, the second hybrid bonded device comprising a third device and a fourth device, the fourth device hybrid bonded face-to-face to the third device, the third device including a second substrate having a plurality of second bonding connectors and a second bonding layer disposed on a surface thereof, wherein the plurality of second bonding connectors of the third device is coupled to the plurality of first bonding connectors of the first device, and wherein the second bonding layer of the third device is coupled to the first bonding layer of the first device.

2. The semiconductor device according to claim 1, wherein the first device and the second device are hybrid bonded by a plurality of third bonding connectors, wherein the third device and the fourth device are hybrid bonded by a plurality of fourth bonding connectors, wherein the third bonding connectors are disposed in an uppermost interconnect layer of the first device and the second device, and wherein the fourth bonding connectors are disposed in an uppermost interconnect layer of the third device and the fourth device.

3. The semiconductor device according to claim 1, wherein the fourth device comprises a third substrate comprising a plurality of third bonding connectors disposed proximate a surface thereof.

4. The semiconductor device according to claim 3, further comprising a contact pad coupled to each of the plurality of third bonding connectors.

5. The semiconductor device according to claim 4, further comprising a connector coupled to each of the plurality of contact pads.

6. The semiconductor device according to claim 3, wherein the fourth device comprises a third bonding layer disposed on the surface thereof, wherein the semiconductor device further comprises at least one fifth device, and wherein the at least one fifth device is hybrid bonded to the plurality of third bonding connectors and the third bonding layer of the fourth device.

7. The semiconductor device according to claim 6, wherein a first side of the at least one fifth device is hybrid bonded to the fourth device, and wherein a plurality of contact pads is coupled to a second side of the at least one fifth device, the second side being opposite the first side.

8. The semiconductor device according to claim 7, wherein the first side comprises a front side or a back side of the at least one fifth device.

9. The semiconductor device according to claim 6, wherein the semiconductor device comprises an odd number of the at least one fifth devices, and wherein a top fifth device comprises a plurality of contact pads coupled to an uppermost interconnect layer of an interconnect structure of the top fifth device.

10. The semiconductor device according to claim 6, wherein the semiconductor device comprises an even number of the at least one fifth devices, and wherein a top fifth device comprises a plurality of contact pads coupled to a plurality of fourth bonding connectors disposed in a substrate of the top fifth device.

11. The semiconductor device according to claim 1, wherein the plurality of first bonding connectors and the plurality of second bonding connectors comprise hybrid bond pad (HBP) connectors.

12. A semiconductor device, comprising:
    a first device comprising a first face side bonding connector and a first face side bonding layer;
    a second device vertically stacked above the first device and hybrid bonded to the first device in a face-to-face configuration, the second device comprising a second face side bonding connector bonded to the first face side bonding connector and comprising a second face bonding layer bonded to the first face side bonding layer, the second device further comprising a first back side bonding connector formed in a substrate thereof and a first back side bonding layer formed on a back side of the substrate;
    a third device vertically stacked above the second device and hybrid bonded to the second device in a back-to-back configuration, the third device comprising a second back side connector formed in a substrate thereof bonded to the first back side bonding connector and a second back side bonding layer bonded to the first back side bonding layer, the third device further comprising a third face side bonding connector and a third face side bonding layer; and
    a fourth device vertically stacked above the third device and hybrid bonded to the third device in a face-to-face configuration, the fourth device comprising a fourth face side bonding connector bonded to the third face side bonding connector and a fourth face side bonding layer bonded to the third face side bonding layer.

13. The semiconductor device according to claim 12, wherein the fourth device comprises a third back side connector formed in a substrate thereof and a third back side bonding layer.

14. The semiconductor device according to claim 12, further comprising:
    a fifth device hybrid bonded in a face-to-face configuration to the fourth device, the fifth device comprising a contact pad; and
    a connector electrically connected to the contact pad.

15. The semiconductor device according to claim 12, wherein the second device is hybrid bonded to the first device, the third device is hybrid bonded to the second device, and the fourth device is hybrid bonded to the third device using both an oxide-oxide bond and a copper-copper bond.

16. A method of manufacturing a semiconductor device, the method comprising:
    forming a first stacked device by forming a face side bonding connector and a face side passivation layer on face sides of a first device and a second device;

hybrid bonding the first device and the second device by bonding together the face side passivation layers of the first device and the second device and bonding together the face side bonding connectors of the first device and the second device; and forming a back side bonding connector and a back side passivation layer on a back side of the first device;

forming a second stacked device by forming a face side bonding connector and a face side passivation layer on face sides of a third device and a fourth device;

hybrid bonding the third device and the fourth device by bonding together the face side passivation layers of the third device and the fourth device and bonding together the face side bonding connectors of the third device and the fourth device; and forming a back side bonding connector and a back side passivation layer on a back side of the third device; and hybrid bonding the first stacked device and the second stacked device by bonding together the back side passivation layers of the first device and the third device and bonding together the back side bonding connectors of the first device and the third device.

17. The method according to claim 16, wherein forming the back side bonding connector of the first device or forming the back side bonding connector of the third device comprises:

etching a trench in a back side of a substrate of the first device or the third device through to a metal interconnect layer of the first device or the third device; and filling the trench with a conductive material to form the back side bonding connector for the first device or the third device.

18. The method according to claim 16, further comprising thinning a substrate of the second device and the fourth device.

19. The method according to claim 16, wherein hybrid bonding the first device and the second device, hybrid bonding the third device and the fourth device, and hybrid bonding the first stacked device and the second stacked device comprise:

oxide-oxide bonding the face side passivation layers of the first device and the second device, oxide-oxide bonding the face side passivation layers of the third device and the fourth device, and oxide-oxide bonding the back side passivation layers of the first device and the third device; and copper-copper bonding the face side bonding connectors of the first device and the second device, copper-copper bonding the face side bonding connectors of the third device and the fourth device, and copper-copper bonding the back side bonding connectors of the first device and the third device.

20. The method according to claim 16, further comprising forming a plurality of additional stacked devices, and sequentially hybrid bonding each of the plurality of additional stacked devices to a top device of the semiconductor device, wherein a first one of the plurality of additional stacked devices is hybrid bonded to the fourth device.

* * * * *